United States Patent
Sedlmeier et al.

(10) Patent No.: US 6,440,765 B1
(45) Date of Patent: Aug. 27, 2002

(54) METHOD FOR FABRICATING AN INFRARED-EMITTING LIGHT-EMITTING DIODE

(75) Inventors: Reinhard Sedlmeier, Neutraubling; Ernst Nirschl, Wenzenbach; Norbert Stath, Regensburg, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/246,747

(22) Filed: Feb. 8, 1999

Related U.S. Application Data

(63) Continuation of application No. PCT/DE97/01641, filed on Aug. 4, 1997.

(30) Foreign Application Priority Data

Aug. 7, 1996 (DE) .......................................... 196 31 906

(51) Int. Cl.⁷ .......................... H01L 21/00; H01L 21/20; H01L 21/36
(52) U.S. Cl. ........................ 438/47; 438/46; 438/497; 438/507; 117/54; 117/104
(58) Field of Search ........................... 438/46, 47, 497, 438/507, 930, 977; 117/54, 56, 104, 954

(56) References Cited

U.S. PATENT DOCUMENTS

| | | | |
|---|---|---|---|
| 4,680,602 A | * | 7/1987 | Watannabe et al. ............ 357/17 |
| 4,902,356 A | | 2/1990 | Noguchi et al. |
| 5,070,510 A | | 12/1991 | Konushi et al. |
| 5,115,286 A | | 5/1992 | Camras et al. |
| 5,233,204 A | | 8/1993 | Fletcher et al. |
| 5,869,849 A | * | 2/1999 | Jou et al. ...................... 257/96 |

FOREIGN PATENT DOCUMENTS

| | | |
|---|---|---|
| EP | 0325493 A2 | 7/1989 |
| EP | 0420691 A2 | 4/1991 |
| JP | 360053011 * | 3/1985 |

OTHER PUBLICATIONS

"Gallium Arsenide: Materials, Devices, and Circuits", edited by M.J. Howes and D.V. Morgan Wiley–Interscience Publication, Dec. 1986, p. 99.*

"Twofold efficiency improvement in high performance AlGaInP light–emitting diodes in the 555–620 nm spectral region using a thick GaP window layer", Huang et al., Appl. Phys. Lett. 61(9), Aug. 1992, pp. 1045–1047.

* cited by examiner

Primary Examiner—Carl Whitehead, Jr.
Assistant Examiner—Pamela E Perkins
(74) Attorney, Agent, or Firm—Laurence A. Greenberg; Werner H. Stemer; Ralph E. Locher

(57) ABSTRACT

A method for fabricating an infrared-emitting light-emitting diode in which a layer sequence is applied onto a semiconductor substrate, preferably composed of GaAs. The layer sequence has, proceeding from the semiconductor substrate, a first AlGaAs cover layer, a GaAs and/or AlGaAs containing active layer and a second AlGaAs cover layer. In which case, the first AlGaAs cover layer and the active layer are fabricated by a metal organic vapor phase epitaxy (MOVPE) method and the second AlGaAs cover layer is fabricated by a liquid phase epitaxy (LPE) method. Furthermore, an electrically conductive coupling-out layer having a thickness of at least about 10 $\mu$m is deposited on the second AlGaAs cover layer by the LPE method. The coupling-out layer is optically transparent in the infrared spectral region.

11 Claims, 1 Drawing Sheet

METHOD FOR FABRICATING AN INFRARED-EMITTING LIGHT-EMITTING DIODE

CROSS-REFERENCE TO RELATED APPLICATION

This is a continuation of copending International Application PCT/DE97/01641, filed Aug. 4, 1997, which designated the United States.

BACKGROUND OF THE INVENTION

Field of the Invention

The invention relates to a method for fabricating an infrared-emitting light-emitting diode in which an active layer sequence is applied on a semiconductor substrate, preferably composed of GaAs. The active layer sequence emits infrared (IR) radiation during operation of the light-emitting diode and has, proceeding from the semiconductor substrate, a first AlGaAs cover layer, a GaAs and/or AlGaAs containing active layer and a second AlGaAs cover layer.

Light-emitting diodes (LEDs) are used as transmission elements particularly in optical communications technology. Depending on the desired wavelength of the emitted light, use is made of different semiconductor systems whose respectively underlying semiconductor materials also entail different fabrication methods each having independent technological approaches to problems. In the visible spectral region with wavelengths of about 400 to 800 nm, use is made of an AlGaInP alloy system in which the desired wavelength from a relatively wide color range can be defined by setting the aluminum content. It is necessary to distinguish between the latter case and the case of light-emitting diodes which operate with longer wavelengths in the infrared region and, as a rule, are based on an AlGaAs system in which wavelengths of the emitted light of above about 800 nm can be achieved by setting the aluminum content in the typical range from about 10% to 30%. The present invention is concerned with the fabrication of such infrared-emitting light-emitting diodes based on an AlGaAs system. In the case of the infrared-emitting light-emitting diodes to date, the entire layer sequence to be applied to the GaAs substrate has been fabricated by the LPE (Liquid Phase Epitaxy) method. In the LPE method, in order to form an epitaxial layer, a melt which is supersaturated at a specific temperature and is composed of the correspondingly desired doping materials is brought into contact with the substrate crystal made of GaAs, with the result that an epitaxial layer of GaAs or AlGaAs is formed on the substrate crystal during subsequent cooling. In this way, it is possible to grow single-crystal layers of different compositions in accordance with the phase diagrams. The liquid phase epitaxy method has relatively high growth rates and, therefore, is also suitable for the fabrication of relatively thick epitaxial layers. The fact that the relatively thick AlGaAs LPE layers deposited according to the previous method lead to mechanical stresses and hence to warped epitaxial wafers, which are difficult to process in subsequent technological steps, is regarded as disadvantageous precisely in connection with the fabrication of the layer sequence in infrared-emitting light-emitting diodes of the AlGaAs system of interest here. For this reason, the method used to date for fabricating infrared-emitting light-emitting diodes in the wafer composite is limited to-semiconductor substrates having a wafer diameter of at most two inches.

In a refinement of the invention, the infrared-emitting light-emitting diodes are equipped with a so-called coupling-out layer for the purpose of improving the optical coupling-out efficiency of the light radiated from the light-emitting diode. In this case, the optical coupling-out efficiency is initially determined to a large extent by the layer structure of the underlying semiconductor material. If the actual generation of light takes place in a thin layer, designated in summary as the active layer, and includes a so-called active zone, for example as in the case of light-emitting diodes with a double hetero-layer' structure, or a light-generating zone formed around a pn junction, as in the case of homo-pn light-emitting diodes, then cover layers disposed on both sides and having a low degree of absorption for the emitted wavelength can distinctly improve the coupling-out efficiency. For this purpose, in the course of fabricating the layer structure, it is necessary to apply relatively thick semiconductor layers such that they are set with a higher energy gap than in the light-generating zone (active layer). The fabrication of such structures is currently produced in situ just using the liquid phase epitaxy method (LPE) or by a combination of different vapor phase epitaxy methods (VPE). In the latter case the light-generating structure is produced, as a rule, by a metal organic chemical vapor deposition (MOVPE) method and the thick coupling-out layer is produced by the VPE method. The comparatively low deposition rates constitute a disadvantage of using a MOVPE method for fabricating LED structures with such thick coupling-out layers. The combination of the MOVPE method and the VPE method has been previously employed for the purpose of fabricating relatively thick window layers having thicknesses of approximately more than 10 $\mu$m and/or coupling-out layers, preferably made of GaAs, which enable a particularly high increase in the coupling-out efficiency. It is also an intention of the invention to specify a new method combination which enables LED structures with thick coupling-out layers to be produced. A difficulty in this context consists, inter alia, in the fact that both the composition and the fabrication conditions for the coupling-out layer also influence the external efficiency since the extent of damage to the sensitive layer structures (double hetero-layer in the case of an active zone, or pn junction) is determined by the aforementioned parameters.

The fabrication of light-emitting diodes in the visible spectral region of wavelengths from 555 to 620 nm on the basis of an AlGaInP alloy system has been disclosed in U.S. Pat. No. 5,233,204 and in the reference by K. H. Huang et al., Appl. Phys. Lett. 61 (9), Aug. 31, 1992, pages 1045–1047. These light-emitting diodes include a layer sequence which, proceeding from a GaAs substrate, has a first AlGaInP cover layer of the n-type, an active zone made of AlGaInP of the n-type and a second AlGaInP cover layer of the p-type. The two cover layers each have a thickness of about 800 nm. The active zone has a thickness of about 500 nm. The first AlGaInP cover layer, the active zone, and the second AlGaInP cover layer are fabricated by the metal organic chemical vapor deposition (MOCVD) method. Furthermore, it is known to form an optically transparent coupling-out layer made of GaP, AlGaAs, or GaAsP with a thickness of at least 15 $\mu$m above the second AlGaInP cover layer. It being possible for the optically transparent coupling-out layer to be fabricated by the vapor phase epitaxy (VPE) method. In this case, the coupling-out layer serves to increase the effective light radiation of the light-emitting diode by increasing the quantity of light emitted laterally and by reducing the quantity of light absorbed by the light-absorbing substrate. For this purpose, the coupling-out layer has a thickness of at least 0.06 times the width of the light-emitting diode. In this case, the optical refractive index of the coupling-out layer is chosen such that the proportion of light that is absorbed within the light-emitting diode is reduced. The proportion of light that is absorbed within the light-emitting diode is determined by the angle of total reflection.

SUMMARY OF THE INVENTION

It is accordingly an object of the invention to provide a method for fabricating an infrared-emitting light-emitting diode that overcomes the above-mentioned disadvantages of the prior art methods of this general type, in which, even with the deposition of relatively thick AlGaAs layers, the mechanical stresses generated are reduced, and which is also suitable, accordingly, for the problem-free fabrication of a multiplicity of light-emitting diodes in the wafer composite with wafer diameters of more than two inches.

With the foregoing and other objects in view there is provided, in accordance with the invention, a method for fabricating an infrared-emitting light-emitting diode, which includes: applying an active layer sequence on a semiconductor substrate, the active layer sequence emitting infrared radiation during operation of the active layer sequence, the active layer sequence, includes: forming a first AlGaAs cover layer on the semiconductor substrate using a metal organic vapor phase epitaxy (MOVPE) fabrication method; forming an active layer on the first AlGaAs cover layer using the MOVPE fabrication method; and forming a second AlGaAs cover layer on the active layer using a liquid phase epitaxy (LPE) fabrication method.

The invention consists in fabricating the first AlGaAs cover layer and the active zone by the MOVPE method and the second AlGaAs cover layer by the LPE method. The inventive combination of using MOVPE and LPE fabrication methods in the production of the infrared-emitting light-emitting diode on the basis of the AlGaAs system have the below noted advantages over the methods used to date.

For the purpose of optimum structural matching, which is essential for good charge carrier mobility and a high lifetime of the epitaxial layers, the first AlGaAs cover layer, which is particularly critical in respect to mechanical stresses, and the active layer are produced by the MOVPE method. In the MOVPE method the metal used takes place [sic] by way of transport in the vapor phase by preferably, trimethylgallium as a carrier gas at a low vapor pressure. In this case, the deposition takes place far below the melting point of the GaAs crystal, thereby distinctly suppressing the incorporation of impurities from the epitaxy system. Given a total thickness of the active layer structure, including the cover layers and the active zone, of, typically, about 10 $\mu$m, the deposition rates available in the MOVPE method are still sufficiently high. The LPE method is chosen for the fabrication of the second AlGaAs cover layer, the LPE method being simpler and more cost-effective to carry out and affording significantly higher deposition rates and, therefore, being particularly suitable for larger layer thicknesses. After they have been fabricated, epitaxial wafers fabricated in this way are warped distinctly less than epitaxial wafers fabricated according to the methods known heretofore.

In order to fabricate relatively thick window layers or coupling-out layers having thicknesses of approximately more than 10 $\mu$m or even self-supporting coupling-out layers having thicknesses of approximately more than 70 $\mu$m on the second cover layer, it is proposed, following the principle of the invention, to provide a method combination of metal organic vapor based epitaxy for the first cover layer and the active layer and liquid phase epitaxy for the second cover layer and the coupling-out layer. This affords a novel, advantageous realization for the purpose of fabricating the desired infrared-emitting light-emitting diodes, in which case, for the liquid phase deposition, those LPE method variants are employed, in particular, which entail the lowest possible thermal loading on the light-generating layer structure, in other words, by way of example, a temperature difference LPE method. The substrate, an absorbing one in the case of GaAs, is subsequently etched away or removed and the result achieved is that IR light-emitting diodes fabricated in this way have a particularly high coupling-out efficiency.

In accordance with an added feature of the invention, there is the step of forming at least one of the first AlGaAs cover layer and the second AlGaAs cover layer with an Al content of about 10% to about 35%.

In accordance with an additional feature the invention, there is the step of depositing an electrically conductive coupling-out layer having a thickness of at least about 10 $\mu$m and being optically transparent in an infrared spectral region on the second AlGaAs cover layer using the LPE fabrication method.

In accordance with another feature of the invention, there is the step of depositing the electrically conductive coupling-out layer so as to be self-supporting and having the thickness of at least about 50 $\mu$m.

In accordance with a further added feature of the invention, there is the step of forming the electrically conductive coupling-out layer from AlGaAs with an Al content in a range of between about 20% to about 35%.

In accordance with a further additional feature of the invention, there is the step of producing the electrically conductive coupling-out layer in a number of individual LPE steps during the depositing step.

In accordance with a concomitant feature of the invention, there is the step of depositing the electrically conductive coupling-out layer by a temperature difference LPE fabrication method.

Other features which are considered as characteristic for the invention are set forth in the appended claims.

Although the invention is illustrated and described herein as embodied in a method for fabricating an infrared-emitting light-emitting diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
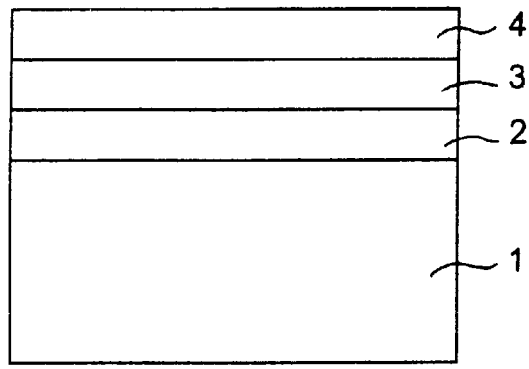
FIG. 1 is a diagrammatic sectional view of a first exemplary embodiment of an IR light-emitting diode in accordance with the invention.

In all the figures of the drawing, sub-features and integral parts that correspond to one another bear the same reference symbol in each case. Referring now to the figures of the drawing in detail and first, particularly, to FIG. 1 thereof, there is shown an infrared-emitting light-emitting diode fabricated by a method according to the invention. The infrared-emitting light-emitting diode includes a semiconductor substrate 1 made of GaAs, on which an active layer sequence is applied. The layer sequence emitting IR radiation during operation of the light-emitting diode and, proceeding from the semiconductor substrate 1, has a first $Al_xGa_{1-x}As$ cover layer 2, where x=0.35, an active layer 3 and a second $Al_xGa_{1-x}As$ cover layer 4, where x=0.35. The active layer 3 according to the exemplary embodiment in accordance with FIG. 1 constitutes an AlGaAs double heterostructure where the emitted IR radiation has a wavelength of about 830 nm. Alternatively, the active layer 3 may also be formed as a homo-pn junction. The layer structure illustrated in FIG. 1 is suitable, in particular, for fabricating particularly fast infrared-emitting light-emitting diodes.

The first $Al_xGa_{1-x}As$ cover layer 1 and the active layer 3 are fabricated by an MOVPE (metal organic vapor phase epitaxy) method, while the second $Al_xGa_{1-x}As$ cover layer 4 is produced an LPE (liquid phase epitaxy) method.

Figure 2:
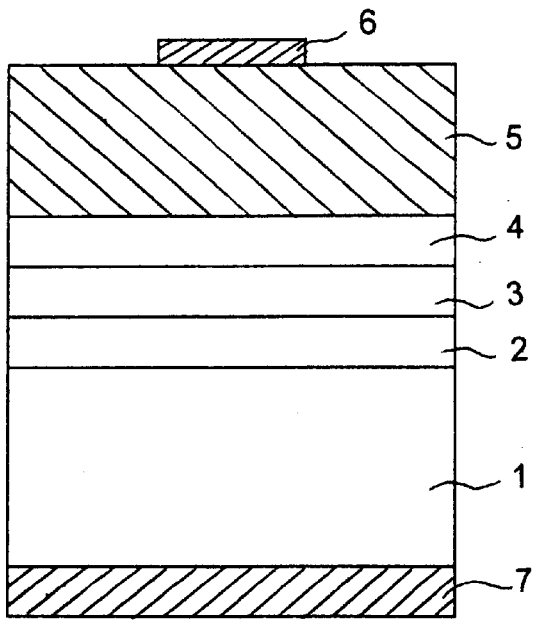
FIG. 2 is a sectional view of a second exemplary embodiment of the IR light-emitting diode.

In the exemplary embodiment illustrated in FIG. 2, an $Al_xGa_{1-x}As$ coupling-out layer 5, where x=0.2–0.4, is additionally deposited above the second $Al_xGa_{1-x}As$ cover layer 4. The $Al_xGa_{1-x}As$ coupling-out layer 5 is deposited by the LPE method and has a total thickness of about 10 μm to about 50 μm. The reference numerals 6 and 7 designate electrically conductive electrode terminals, which are omitted in the illustration according to FIG. 1 for simplicity.

Figure 3:
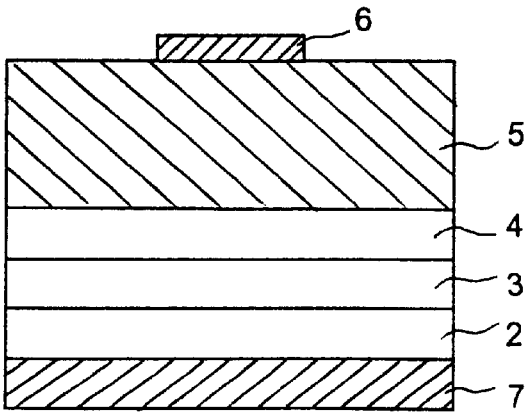
FIG. 3 is a sectional view of a third exemplary embodiment of the IR light-emitting diode.

In the exemplary embodiment according to FIG. 3, the $Al_xGa_{1-x}As$ coupling-out layer 5 is configured as a self-supporting layer having a thickness of at least about 50 μm, and the optically absorbing substrate 1 is removed by etching or a similar removal step. In this exemplary embodiment, the self-supporting coupling-out layer 5 serves, to an extent, as a transparent substrate which supports the structure including the layers 2, 3, 4, and 6, 7.

The exemplary embodiments illustrated in FIGS. 2 and 3 are suitable, in particular, for fabricating particularly bright infrared-emitting light-emitting diodes.

We claim:

1. A method for fabricating an infrared-emitting light-emitting diode, which comprises:

applying an active layer sequence on a semiconductor substrate, the active layer sequence emitting infrared radiation during operation of the active layer sequence, the active layer sequence, includes:
forming a first AlGaAs cover layer on the semiconductor substrate using a metal organic vapor phase epitaxy (MOVPE) fabrication method;
forming an active layer on the first AlGaAs cover layer using the MOVPE fabrication method;
forming a second AlGaAs cover layer on the active layer using a liquid phase epitaxy (LPE) fabrication method;
and
depositing an electrically conductive coupling-out layer having a thickness of at least about 10 μm and being optically transparent in an infrared spectral region on the second AlGaAs cover layer using the LPE fabrication method.

2. The method according to claim 1, wherein the active layer contains GaAs.

3. The method according to claim 1, wherein the active layer contains AlGaAs.

4. The method according to claim 1, which comprises forming at least one of the first AlGaAs cover layer and the second AlGaAs cover layer with an Al content of about 10% to about 35%.

5. The method according to claim 1, which comprises depositing the electrically conductive coupling-out layer so as to be self-supporting and having the thickness of at least about 50 μm.

6. The method according to claim 5, which comprises removing the semiconductor substrate after the electrically conductive coupling-out layer has been deposited.

7. The method according to claim 1, which comprises forming the semiconductor substrate from GaAs.

8. The method according to claim 5, which comprises forming the electrically conductive coupling-out layer from AlGaAs with an Al content in a range of between about 20% to about 35%.

9. The method according to claim 5, which comprises producing the electrically conductive coupling-out layer in a number of individual LPE steps during the depositing step.

10. The method according to claim 1, which comprises depositing the electrically conductive coupling-out layer by a temperature difference LPE fabrication method.

11. A method for fabricating an infrared-emitting light-emitting diode array, which comprises:

applying an active layer sequence on a semiconductor substrate having a diameter of more than two inches, the active layer sequence emitting infrared radiation during operation of the active layer sequence, the active layer sequence, includes:
forming a first AlGaAs cover layer on the semiconductor substrate using a metal organic vapor phase epitaxy (MOVPE) fabrication method;
forming an active layer on the first AlGaAs cover layer using the MOVPE fabrication method; and
forming a second AlGaAs cover layer on the active layer using a liquid phase epitaxy (LPE) fabrication method;
and
fabricating the semiconductor substrate having the active layer sequence into a multiplicity of infrared-emitting light-emitting diodes.

* * * * *